United States Patent
Ladd et al.

[11] Patent Number: 6,100,463
[45] Date of Patent: Aug. 8, 2000

[54] METHOD FOR MAKING ADVANCED THERMOELECTRIC DEVICES

[75] Inventors: Michael M. Ladd, Renton; Kin Li, Bellevue; Frederick D. McKenney, Seattle; Minas H. Tanielian, Bellevue, all of Wash.

[73] Assignee: The Boeing Company, Seattle, Wash.

[21] Appl. No.: 08/972,636

[22] Filed: Nov. 18, 1997

[51] Int. Cl.[7] .................................................. H01L 35/00
[52] U.S. Cl. .......................................... 136/201; 136/205
[58] Field of Search .................................... 136/201, 203, 136/205, 206; 62/3.2, 3.3

[56] References Cited

U.S. PATENT DOCUMENTS

| | | | |
|---|---|---|---|
| 3,248,777 | 5/1966 | Stoll | 29/155.5 |
| 3,261,079 | 7/1966 | Clingman, Jr. et al. | 29/155.5 |
| 3,264,714 | 8/1966 | Baer, Jr. | 29/155.5 |
| 3,276,105 | 10/1966 | Alais et al. | 29/155.5 |
| 3,409,475 | 11/1968 | Breneman | 136/203 |
| 3,594,803 | 7/1971 | Pucillo | 343/720 |
| 3,958,324 | 5/1976 | Alais et al. | 29/573 |
| 4,149,025 | 4/1979 | Niculescu | 136/206 |
| 4,465,895 | 8/1984 | Verner et al. | 136/225 |
| 4,902,648 | 2/1990 | Ohta et al. | 437/247 |
| 5,006,505 | 4/1991 | Skertic | 505/1 |
| 5,705,434 | 1/1998 | Imanishi et al. | 437/247 |
| 5,763,293 | 6/1998 | Yamashita et al. | 438/55 |
| 5,837,929 | 11/1998 | Adelman | 136/225 |
| 5,886,291 | 3/1999 | Imanishi et al. | 136/203 |
| 5,936,192 | 8/1999 | Tauchi | 136/203 |

*Primary Examiner*—Kathryn Gorgos
*Assistant Examiner*—Thomas H Parsons
*Attorney, Agent, or Firm*—John C. Hammar

[57] ABSTRACT

Semiconductor materials optimized for their electrical conductivity and thermal conductivity promise much higher thermoelectric cooling power. The materials can achieve the same cooling or power generation capacity in thermopiles with less electron current compared with present bulk materials. Because less electron current is required to accomplish the same task, total thermopile semiconductor material cross-sectional area normal to thermal and electron flow is greatly reduced and the element length-to-cross-sectional area aspect ratio is increased. The net result is a significant improvement in the figure of merit, ZT, and in the device Coefficient of Performance (COP).

5 Claims, 7 Drawing Sheets

COP vs. ZT for a thermoelectric generator for (a) COP1 : Th = 373K, (b) COP2: Th = 473K (c) COP3: Th = 673K, Tc = 100K for all cases.

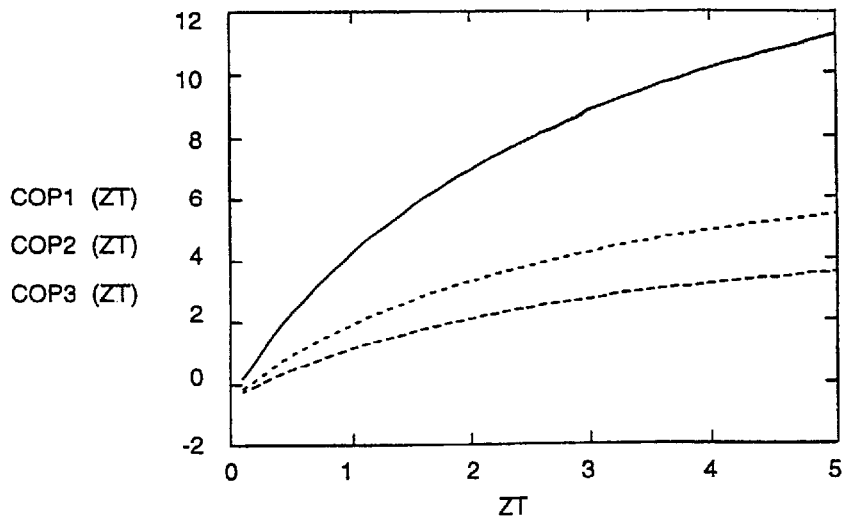

Figure 9

COP vs. ZT for a thermoelectric refrigerator for (a) COP1: Th - Tc = 10K
(b) COP2: Th -Tc = 20K (c) COP3: Th -Tc = 30K. Tc = 300K in all cases.

|  | SiGe/Si QW | $Bi_2Te_3$/B4C QW | BiSb/PbTeSe QW | BiSbTe/ BiSbTeSe QW | n-BiSbTeSe single layer | p-BiSbTe single layer | $Bi_2Te_3$ bulk |
|---|---|---|---|---|---|---|---|
| thick/period | ----/10 nm | 690nm/23.5nm | 1.7μm/25.8nm | ----/14nm | 9μm | 6μm | ---- |
| resistivity | 2 mohm-cm | 38 mohm-cm | 1.1 mohm-cm | 1.4 mohm-cm | 0.94 mohm-cm | 0.62 mohm-cm | 2 mohm-cm |
| Seebeck coefficient | -1250 μV/K | -480 μV/K | -12 μV/K | 140 μV/K | -85 μV/K | 120 μV/K | 220 μV/K |
| thermal conductivity | ---- | ---- | ---- | 0.014 W/cm/K | 0.014 | 0.014 | 0.03 W/cm/K |
| ZT @ 300K | 1.5 | ---- | ---- | 0.3 | 0.16 | 0.5 | 1 |
| substrate temperature | 600-700 C | ---- | 15 C | 300-400 C | 300 C | 300 C | ---- |
| source | LLNL-sputter | LLNL | LLNL-sputter | LLNL | LLNL | LLNL | high-Z |

Figure 10

METHOD FOR MAKING ADVANCED THERMOELECTRIC DEVICES

STATEMENT REGARDING FEDERALLY SPONSORED RESEARCH OF DEVELOPMENT

This invention was made with Government support. The Government has certain rights in this invention.

BACKGROUND OF THE INVENTION

1. Technical Field

The present invention relates to microchip fabrication techniques which enable precise periodic assembly of semiconductor materials. The advanced thin film products are thermoelectric or micro-electromechanical (MEMS) devices.

2. Description of the Related Art

Although the thermoelectric effect for cooling, heating, or power generation was discovered over a century ago, currently available thermoelectric devices that capitalize on the effect are limited. Suitable materials for fabricating useful devices are difficult to make or to buy. Existing assembly processes have not produced devices of a practical size. The thermoelectric devices use semiconductor materials to transport heat through steady state electron transport from junction to junction. The thermoelectric effect states that electrical current carries charge as well as heat flux. Cooling occurs in a device when electrons pass from a P-type semiconductor doped to have a deficiency of electrons to an N-type semiconductor (absorbing heat) doped to have an excess of electrons and then pass from the N-type semiconductor to the P-type semiconductor (dissipating heat). A temperature differential or gradient, known as the Peltier effect, arises across the device. If a natural temperature gradient occurs across the device, the device can produce an electrical potential suitable for producing electrical power according to the Seebeck effect. The power generating capacity in such a case is a function of the temperature difference across the device.

The thermoelectric effect has been implemented in commercial devices for only a limited number of applications where the energy efficiency or the maximum achievable temperature difference are not overriding concerns. The thermoelectric devices have found niche markets where the cooling power requirement is small (e.g. milliwatts to watts), such as portable food coolers, laser diode coolers, or infrared detector coolers. Traditional fabrication methods cut bulk thermoelectric materials into small devices, and then connect the devices on thermally conductive face plates. The devices have small areas normally less than 25 $cm^2$ and processing methods limit the minimum device footprint to about 0.5 $cm^2$. Low efficiency arises because the materials must compromise between the optimal electrical resistance and optimal thermal conductance.

As a practical matter, the Peltier and Seebeck effects have been unable to convert electrical power into practical, usable cooling capacity or, conversely, to convert thermal power (i.e., a natural temperature gradient) into electrical power because of the electrical resistance and thermal conductance of the semiconductor material. These factors limit the device efficiency. Additionally, presently available commercial manufacturing processes limit the device size to dimensions much larger than are compatible with the sizes of devices where such heating or cooling could be beneficially applied. Advanced thin film thermoelectrical materials such as quantum well, Skutterudites, and doped $C_{60}$ (Fullerine) materials would allow exploitation of the thermoelectric effect at efficiencies comparable with Carnot cycle engines. Such thin film materials use multilayer quantum confinement, and superlattice structures. They are thin and physically weak compared with standard thermoelectric semiconductor materials. The advanced thin film materials are not strong enough, however, to act alone as structural elements within thermopiles. If low cost, reproducible, high precision methods were available to make devices from these advanced films, a broad range of applications would arise capitalizing on the capabilities these films provide, such as flexibility, variable packing density, and multiple staging.

Micro-electro-mechanical System (MEMS) technology allows the manufacture of mechanical parts having sizes on the order of microns. Microtransducers can out perform traditional (macro) transducers in many applications by orders of magnitude because of their smaller size. The potential for applying MEMS to aerospace engineering is discussed, for example, in the article: Ho, et al, "MEMS—A Technology for Advancements in Aerospace Engineering," 35th Aero. Sci. Mtg., AIAA-97-0545, Reno, Nev. (Jan. 6, 1997), which we incorporate by reference. Micro-sensors and Micro-actuators have potential for controlling shear stress or for providing flight controls.

SUMMARY OF THE INVENTION

Our method of thermopile fabrication produces advanced thermoelectric devices that support cooling over a broad range of areas. We make device arrays of semiconductor elements with the elements placed with high precision in location and orientation. We can vary the semiconductor packing density and geometrical aspect ratio in the device arrays. We combine multiple thermopiles into an array, making use of the extremely high element packing density and aspect ratio. To achieve superior performance, we make the smallest practical elements, but package them into practical thermolectric devices in this way. The thermopile arrays can be used in a broader range of temperature and spatial requirements because of their improved overall performance and dimensional flexibility. For certain applications, such as heat reclamation, large area thermopile arrays with low element packing density allow efficient electrical power generation from thermal sources which otherwise would waste heat. Our method uses a unique semiconductor microfabrication technique in conjunction with printed circuit board, integrated circuit, metallization, and "pick and place"/flip-chip technologies.

Rather than handling thermopile elements individually, we fabricate array devices using multiple thermopile doped P & N type thermopile slices which are laminated together to form a periodic block of spacers and thermoelectric materials. This array of thermopile slices is then sectioned and periodically metalized to produce the required electrical interconnects at each junction. These sheets are then laminated together to form a large integrated array of thermopile junctions. This technique enables dimensional scaling from a given slice fabrication technology base and fabrication yield optimization.

BRIEF DESCRIPTION OF THE DRAWINGS

FIG. 9 is a graph of the typical Coefficient of Performance (COP) for a thermoelectric refrigerator.

FIG. 10 is a table comparing the physical properties of several semiconductor materials usable in the thermoelectric array devices of the present invention.

DETAILED DESCRIPTION OF THE INVENTION

Semiconductor materials optimized for their electrical conductivity and thermal conductivity promise much higher thermoelectric cooling power. These materials can achieve the same cooling or power generation capacity in thermopiles with less electron current compared with present bulk materials. Because less electron current is required to accomplish the same task, total thermopile semiconductor material cross-sectional area normal to thermal and electron flow is greatly reduced. The element length-to-cross-sectional area aspect ratio is increased. The net result is a significant improvement in the figure of merit, ZT, and in the device Coefficient of Performance (COP). Such improvement makes the material suitable for large area devices that will exploit the thermoelectric effect Our microchip fabrication method enables precise periodic assembly of semiconductor materials into thermoelectric or micro-electromechanical (MEMS) devices. The microchip fabrication method is used in conjunction with conventional printed circuit board, integrated circuit, metallization, and pick and place/flip-chip technologies. We start with bulk thermoelectric and spacer materials to fabricate devices that contain multiple thermopile chips between device face sheets. The face sheets contain electrical power distribution leads to allow input or withdrawal of electrical power to the semiconductor materials as the application dictates. The devices can generate electricity by operating across a temperature gradient or can provide refrigeration by transporting heating from a source to a heat sink. The dimensions of the chips and final devices are controllable as the application demands.

A thermopile 10 (FIG. 1) consists of an array of alternating P-type and N-type semiconductors (typically in a checkerboard pattern) sandwiched between two face sheets. Thermopiles convert thermal energy in the form of a temperature gradient directly into electrical energy. Thermopile devices are commercially available for a number of applications, such as non-contact temperature measurement from manufacturers such as EG&G Heimann.

Figure 1:
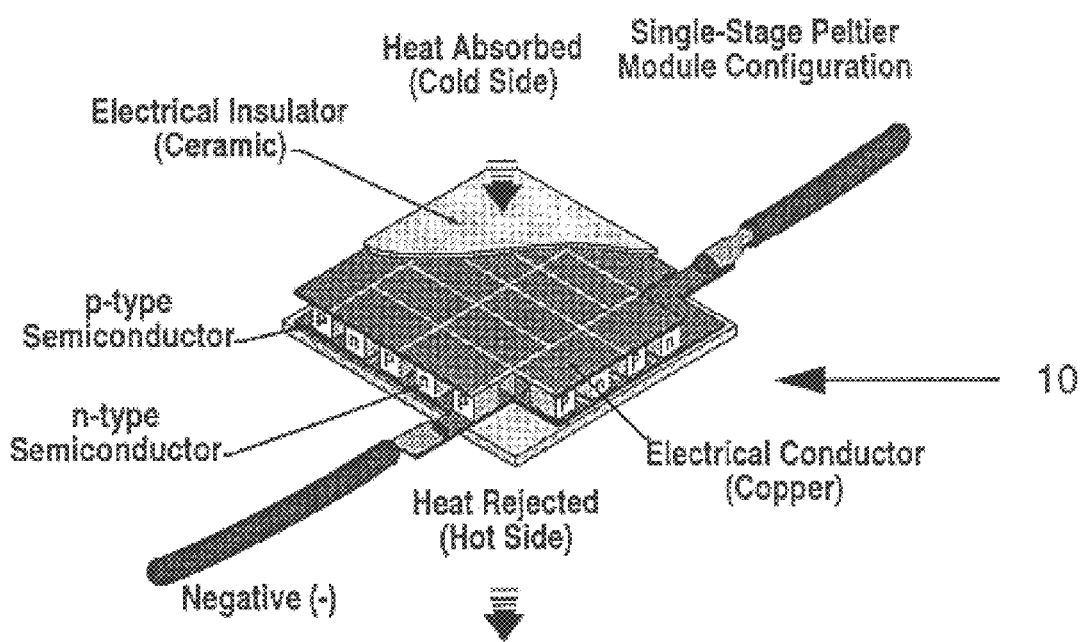
FIG. 1 is an isometric of a typical solid-state, semiconductor thermopile.
Figure 2:
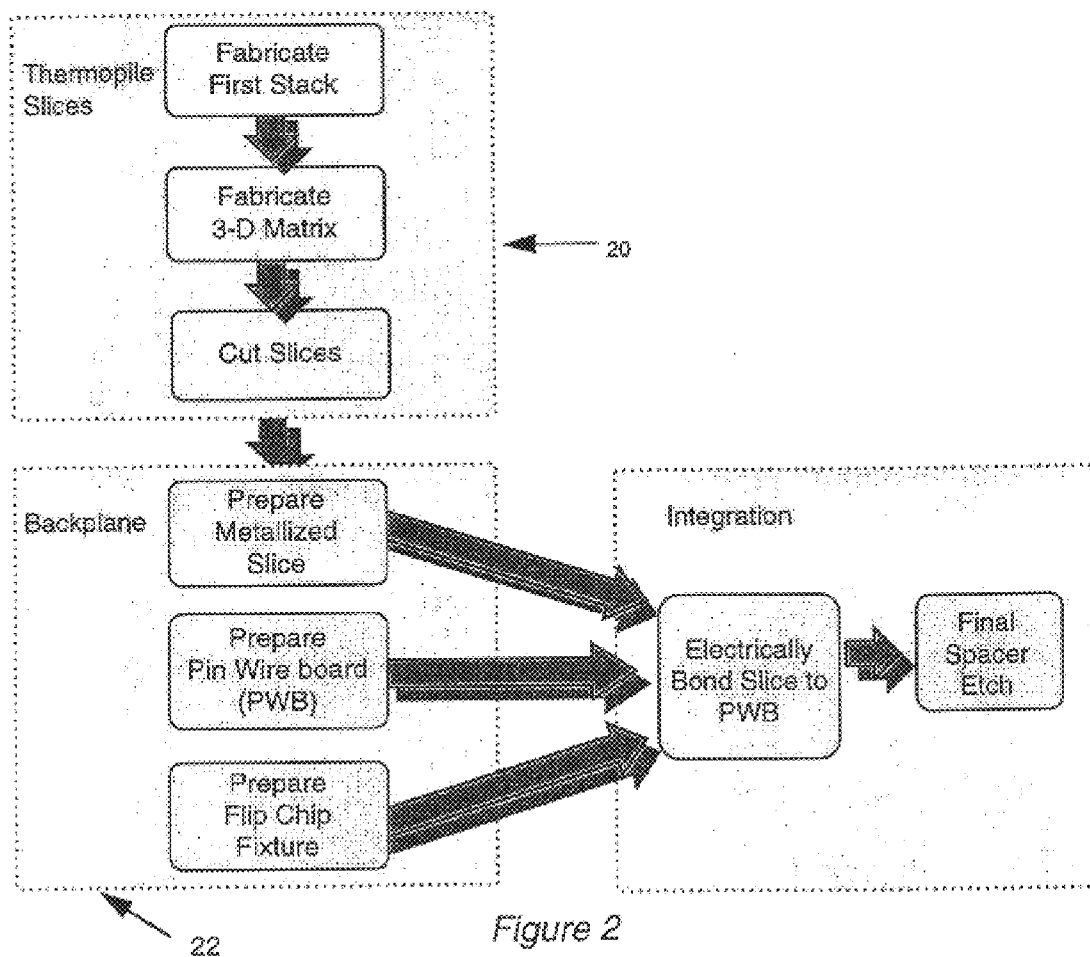
FIG. 2 is a process flowchart for making a thermopile array of the present invention.

Our batch thermopile fabrication process for making thermopile arrays of the present invention is illustrated in FIG. 2. We fabricate thermopile slices (20) containing isolated, tiny semiconductor elements corresponding in arrangement to the semiconductors of the macro-thermopiles of FIG. 1. We interconnect the micro-elements with electrical connections (junctions) and electrical pads. Face sheets (the backplane) (22) are fabricated using printed circuit board etching technology and are bonded to the thermopile slices to complete power distribution circuits. By "thermopile slice", we mean an array (generally in rows and columns) of P-type and N-type micro-devices suitable for interconnection into an array of thermopiles.

Slice metallization is done using metal vapor deposition and photolithography in the desired pattern to produce electrical interconnections and vias. The face sheets (the backplane) contain conductive paths and vias needed for electrical continuity. Printed circuit board technology is used to etch away unwanted portions of a continuous thin electrically conductive sheet contiguous to the structural and thermally conductive face sheet material. Flip-chip/"pick and place" technology places the thermopile slices onto the face sheets in their desired locations. The entire surface area of the face sheet is filled on one side with a matrix of semiconductor elements and spacer materials. A final etch (wet or dry) is done to remove spacer material and to define freestanding semiconductor elements. Using currently available single crystal or sintered semiconductor materials, the spacer material may be etched away so that only the semiconductor material is left to separate the face sheets. With advanced semiconductor sheets, structure is provided with selectively unetched spacer materials or face sheet peripheral close out materials. Performance can be optimized by using low density, low thermal conductivity (i.e. thermally insulative) spacer materials, such as aerogels, in conjunction with vacuum technologies to eliminate thermal conduction and convection between face sheets. Large thermal gradients can be achieved with this high density design.

Figure 4:
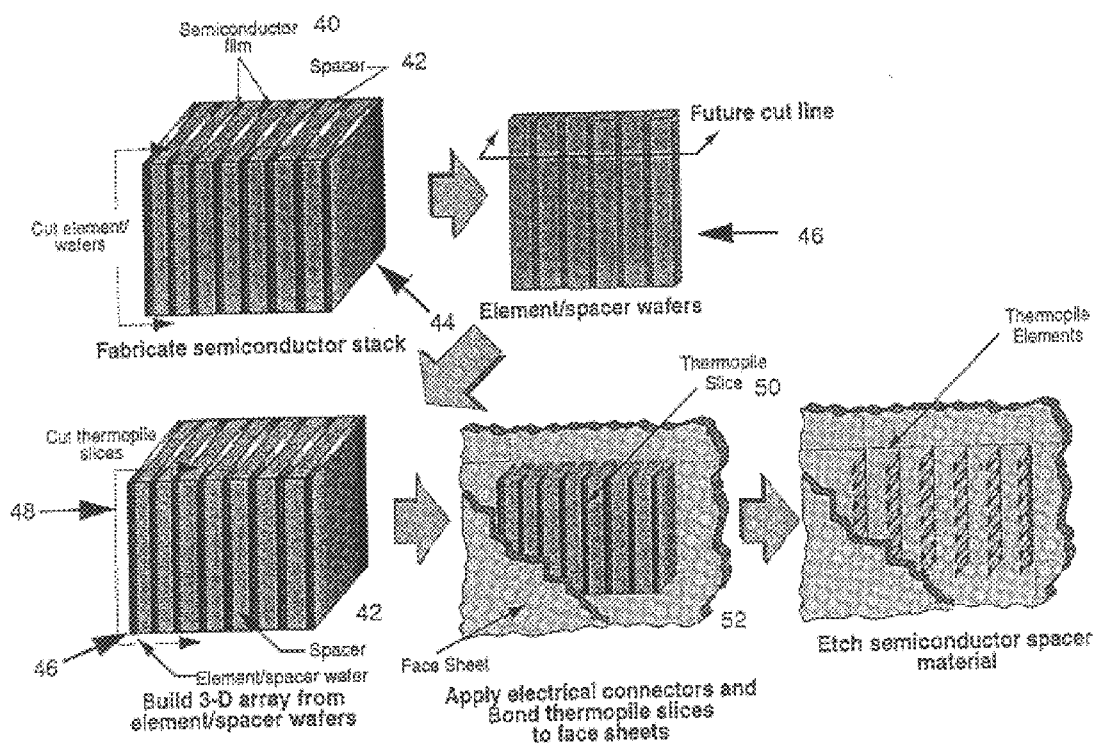
FIG. 4 is a process flowchart illustrating one preferred process for making a thermopile array of the present invention.

Thermopile slices are polished, stacked, and sliced as shown in FIG. 4. Each slice may contain hundreds to thousands of individual thermopile devices. Solid thin sheet semiconductor materials or thin film semiconductor materials deposited on substrates, designated as semiconductor films (40) in FIG. 4, are bonded together with suitable spacer materials (42) and adhesives to form an initial stack (44). Wafers (46) are cut from this stack and polished as required to attain dimensional tolerances. Each wafer has alternating bands of semiconductor material (40) separated by insulating spacer material (42). These wafers (46) are then metallized. A pattern is defined with photolithography processes and etched to form the electrical junctions between each P & N semiconductor sheet. The wafers (46) are bonded together with suitable spacer materials (42) to form a 3-D array (48) having alternating wafers and spacers. The 3-D array (48) is cut to form the desired thermopile array slices (50). These slices have an alternating wafer-spacer configuration. The slices (50) may be polished to the desired dimensional tolerances. Metallization, photolithography and etching may be done to complete electrical connections at this stage rather than at the wafer stage. The slices (50) are then bonded to face sheets (52). Etching of the spacers between the miniature thermopile devices is performed at this point as previously described.

Our micro-electromechanical (MEMS) devices can be used in piezoelectric pressure sensors or actuation systems. Possible applications include manufacture of integrated force arrays (IFA) of the type described in the article: Bobbio et al., "Integrated Force Array: Positioning Drive Applications," Smart Electronics & MEMS Proc., SPIE— the Int'l Soc. for Optical Eng'g, vol. 2722, pp. 123–134 (1996). PZT or PLZT ceramic piezoelectric materials are manufactured into ultrasound transducers that are distributed into a 2-D or phased array format useful for medical imaging applications. The imaging applications are described in the article: Smith et al., "Ultrasonic Imaging,"

vol. 14, p. 213 (1992). Micro-devices are desired for internal imaging devices. PLZT ceramics are described in U.S. Pat. No. 5,607,632. IFAs are described in greater detail in U.S. Pat. Nos. 5,206,557; 5,290,400; 5,434,464; and 5,479,061 which we incorporate by reference and in a number of other technical articles.

Figure 3:
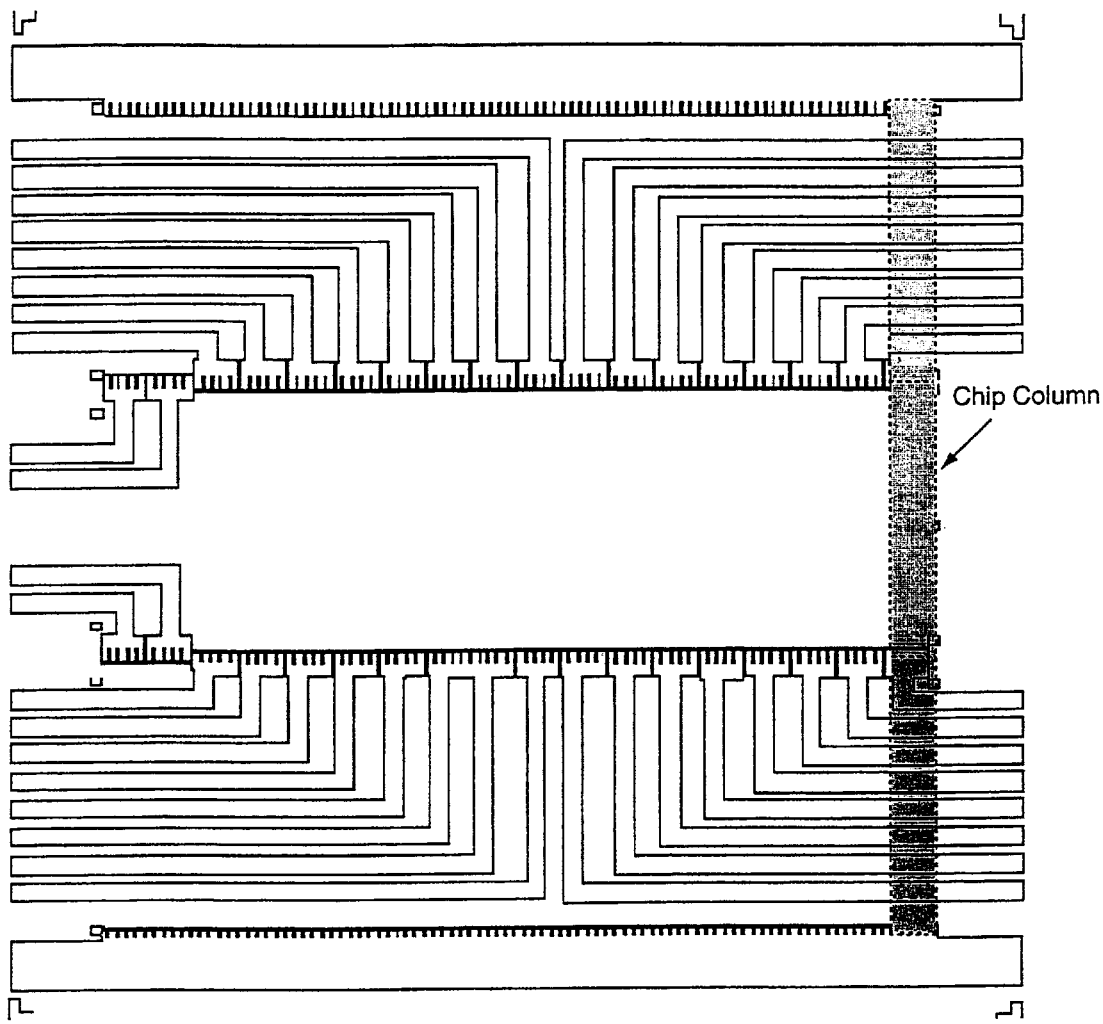
FIG. 3 is a typical face sheet mask for making a power distribution circuit and interconnects on a face sheet.

A typical face sheet material is shown in FIG. 3. The face sheet material is covered with electrical interconnecting metal, typically made of 0.001" thick copper. Photolithography is used to deposit an etch-resist layer where metal is needed for electrical power distribution. The face sheet material provides mechanical support and interfaces with thermal sources and sinks to conduct heat from the device to the environment. The face sheet material may be ceramic, FR4 (fiber glass), polyimide, TEFLON, or even metal. The choice allows flexibility and depends upon anticipated thermal gradients and thermal conductivity requirements. Electrical power leads to the thermopile slices are only required on one face sheet. The power leads are usually on opposite sides from the thermopile slice electrical footings and are fed perpendicularly through the face sheet material to the thermopile slices through electrical vias.

To bond the thermopile slices to the interconnecting face sheets, we use either an electrically conductive adhesive or solder reflow process.

Figure 5:
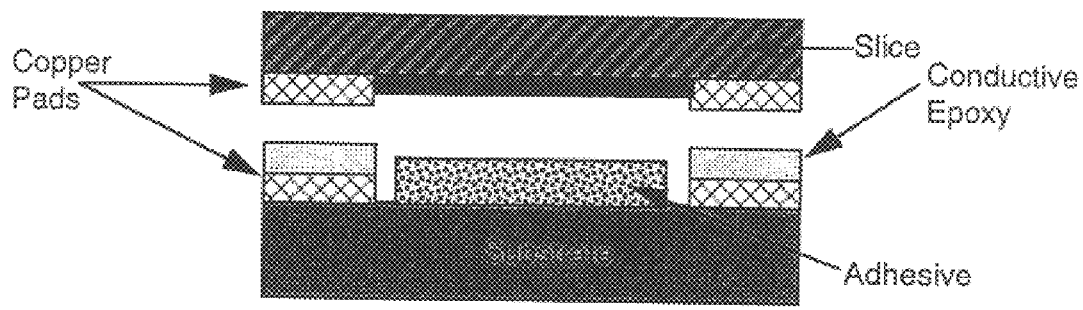
FIG. 5 illustrates a silver epoxy bonding process.

Electrically conductive adhesive: To assemble the slices onto the face sheet, we first use a brass stencil about 0.005" thick to screen print conductive adhesive onto the backplane to cover the pads for joining the chip to the board. A "pick and place" machine sets each thermopile slice into its proper place. The slice is aligned with the conductive adhesive coated pads on the face sheet, lowered, and attached to the adhesive (FIG. 5). The assembly is then cured at room temperature or at elevated temperatures above 100° C.

Figure 6:
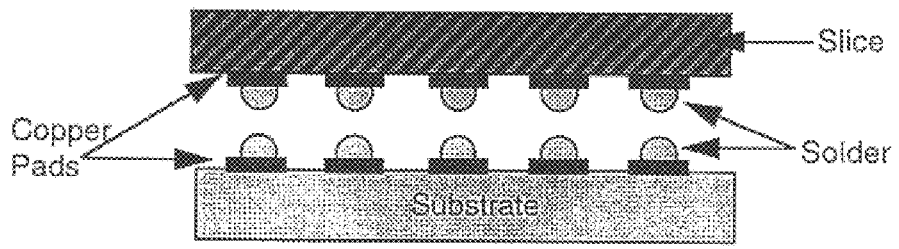
FIG. 6 illustrates a solder reflow bonding process.

Solder Reflow: In the alternative, the copper wiring pad on the face sheet is coated with a solder mask. It is then lowered into a molten solder to coat the pads with a tin-lead or other lower melting point solders. The slices are also coated with the same solder. The slices are aligned and placed over the matching pads on the face sheet (FIG. 6). The whole assembly is then heated to the solder reflow temperature of 135°–185° C. The chips self-align with respect to the bonding pads because of the surface tension of the molten solder and the alignment is set when the solder solidifies.

The thermopiles typically are made from bismuth telluride based semiconductor material. The P-type dopant and the N-type dopant consist of mixtures of antimony and/or selenium. The semiconductor material is produced using powder metal technology, (fine metal powders are hot pressed or sintered to form a block of bulk material). This block is then sliced and polished to form individual thin sheets and bonded to a suitable substrate. The quantum well semiconductor material is deposited by chemical vapor deposition, epitaxy, sputtering, or the like to a depth of about 2000 Å on the spacer material or another suitable substrate. The spacer material is typically about 0.25 cm thick. The semiconductor-spacer wafer that we initially make usually includes 20 layers of alternating P & N slices. We cut the resulting block into a slice having alternating bands of semiconductor and spacer. The wafer slice has a typical thickness of 0.015 cm. We laminate these slices into a stack by adhering the slices to spacer material in the same manner that we prepared the wafer and then surface polish to the correct dimension. When we slice the stack to a thickness of about 0.08 cm, we obtain a generally rectangular sheet having a checkboard of semiconductor islands distributed in rows and columns. This sheet typically has the dimensions of 1.3 cm×7.6 cm×0.08 cm The wafer typically has 20 layers, so the final sheet is a 1.3 cm×7.6 cm array of semiconductor islands. The number of layers and their dimensions can vary as the intended application requires.

Figure 7:
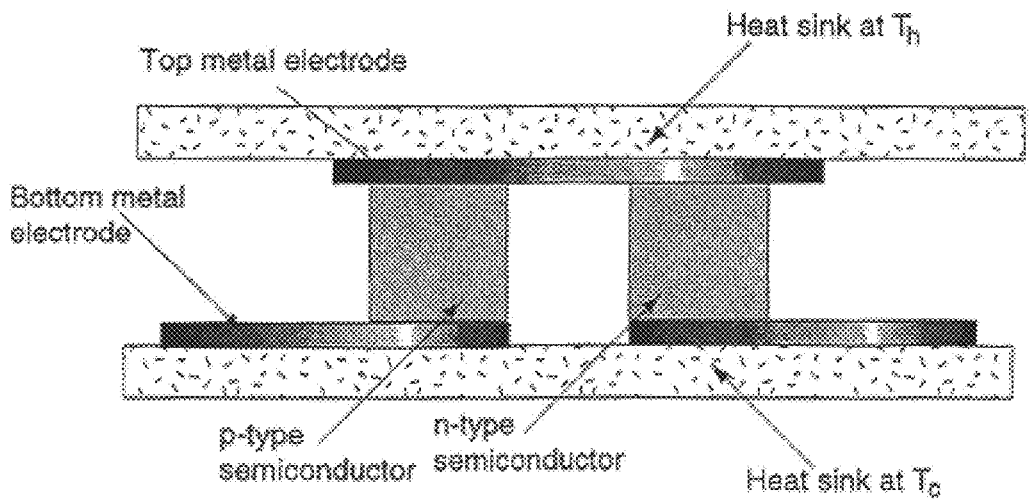
FIG. 7 is a typical elevational view of a solid-state thermoelectric device positioned between a heat source ($T_h$) and heat sink ($T_c$).

A preferred thermoelectric device is shown in FIG. 7. It operates between two heat sink temperatures. One end of the semiconductor thermoelectric material is in contact with a heat source at a higher temperature $T_h$. The other end of the semiconductor is in contact with a heat sink at a lower temperature $T_c$. This device structure may be used as a thermoelectric power generator or heat pump. The dimensionless figure of merit for this device is $$ZT = (\alpha^2/KR)$$

where $\alpha$ is the Seebeck coefficient of the semiconductor, R is the resistance, K is the thermal conductance of a semiconductor leg, and T is the average temperature of $T_h$ and $T_c$. The Coefficient of Performance (COP) of a thermoelectric power generator is the ratio of the available electrical power from the device to the applied thermal power to the device:

$$COP_{max} = \left(\frac{T_h - T_c}{T_h}\right)\left[\frac{\sqrt{1+ZT} - 1}{\sqrt{1+ZT} - \frac{T_c}{T_h}}\right]$$

Figure 8:
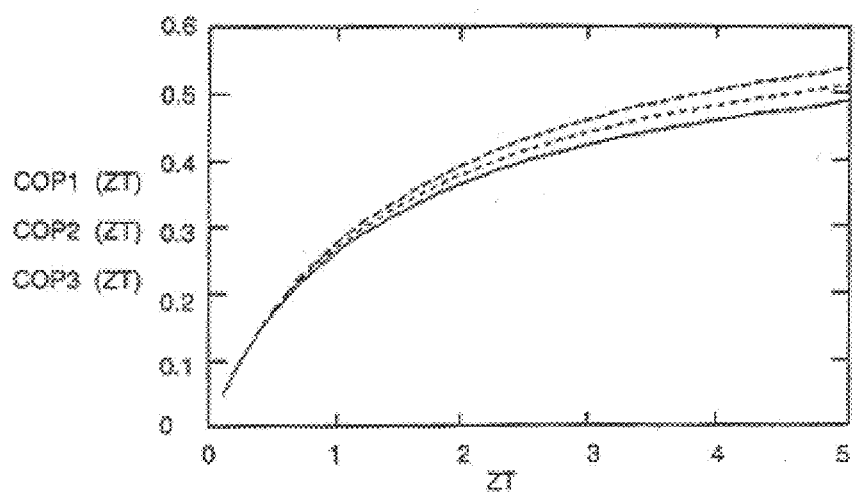
FIG. 8 is a graph of the typical Coefficient of Performance (COP) for a thermoelectric power generator.

The COP is relatively insensitive to changes in $T_h$ in the range from about $T_h$=273–673° K. with a $T_c$ at 100° K. Efficiency increases with the ZT of the material. The efficiency of the devices as a function of ZT and $T_h$ is shown in FIG. 8. The efficiency is about 25% for a material with a ZT of 1, but increases to 45% for a material with a ZT of 3. These values are competitive with or better than solar cell power generation efficiency (5% to 28%) for spacecraft at geosynchronous or low earth orbit, so the thermopile "heat cells" (mounted on a heat pipe to produce the desired gradient) could replace conventional solar cells for space power generation systems. Device structures such as a thermopile slice could be used to generate and store electric power in space by orienting one surface of the slice to deep space while reflecting the sun to the other surface there by generating a temperature gradient across the slice.

The COP of a refrigerator is the ratio of available cooling power to input electrical power:

$$COP_{max} = \left(\frac{T_c}{T_h - T_c}\right)\left[\frac{\sqrt{1+ZT} - \frac{T_h}{T_c}}{\sqrt{1+ZT} + 1}\right]$$

Advantage of a solid-state refrigerator is that it substrates, designated as semiconductor films (40) in FIG. 4, no refrigerant. It is compact and lightweight. The efficiency of these devices as a function of ZT and $T_h$ is shown in FIG. 10. The COP is about 4 for a material with ZT=1 and $T_h$-$T_c$=10° C. The COP is 2 for a device with ZT=3 and $T_h$-$T_c$=30° C.

For generator applications with a high efficiency, a large temperature difference T-$T_c$ is preferred. A small temperature difference is preferred for heat pump applications. In both applications, the efficiency is improved with a material with higher ZT. To capitalize on these characteristics for better efficiency, we use (i) device scaling, (ii) new thin film materials, (iii) effective heat conductor face sheet material, and (iv) modem microfabrication methods to achieve an efficient and low cost thin-film based thermoelectric device.

Device Scaling: The resistance R of each semiconductor leg in a device is proportional to L/A, and the thermal conductance K of each leg is proportional to A/L, where L and A are the length and cross section of a leg. Therefore, scaling of a semiconductor leg (changing its size) does not significantly affect the ZT value of a device. We can exploit this characteristic to miniaturize a bulk thermoelectric device to a thin film form.

Table 1 shows the different dimensions were (a) 0.18"× 0.18"×0.3", (b) 0.006"×0.006"×0.03", (c) 0.005"×0.00025", and (d) 0.1"×0.1"×0.00025", respectively. The A/L ratio effects the device resistance as well as thermal conductance. Device (d) has a high A/L of 102, low electrical resistance, high thermal conductance, and is suitable for high current applications. Devices (a)–(c) have the same low A/L ratio, the same resistance and the same thermal conductance. A thin film device (c) can be made with the same characteristics as those of larger devices (a) and (b).

TABLE 1

| Device Type | Area (A) | Height (L) | A/L | R | K |
|---|---|---|---|---|---|
| (a) Bulk | 0.18" × 0.18" | 0.3" | 0.108" | 0.67 ohm | 93 × $10^{-6}$ W/K |
| (b) miniature | 0.006" × 0.006" | 0.03 | 0.001" | 0.67 ohm | 93 × $10^{-6}$ W/K |
| (c) thin film | .0005" × .0005" | 0.00025" | 0.001" | 0.67 ohm | 93 × $10^{-6}$ W/K |
| (d) thin film | 0.1" × 0.1" | 0.00025" | 40" | 20 × $10^{-6}$ ohm | 3 W/K |

A comparison between four devices of different geometry, using $Bi_2Te_3$ material with a resistivity of 2 mohm-cm and a thermal conductivity of 30 mW/cm/K.

Thin Films: Currently available semiconductor material has a ZT about 1, but advanced thin film materials should have ZT>>1. Using these high ZT thin film materials in our scaled miniaturized device like device (d) will lead to better efficiency in power generators and COP greater than 3 for heat pumps. The new material candidates are $Bi_2Te_3$ thin films, thin films of PbTe or PbSe, or other high ZT quantum well, and Skutterudite materials.

Face Sheet: The coupling of the two ends of a thermoelectric material to the heat sink temperatures $T_h$ and $T_c$ should be effective, otherwise the thermal resistance will degrade the device efficiency. We propose to build the thin film devices on thermally conductive face sheets such as silicon, which will readily conduct heat laterally and provides very low thermal resistance between the thermoelectric material and the two working temperatures $T_h$ and $T_c$.

Semiconductor and Printed Circuit Card Processing: Techniques allow a high volume, low unit cost, high yield, and high reliability.

The best thermoelectric material for our applications is one with a high Seebeck coefficient, high electrical conductivity, and low thermal conductivity. In metals, due to the Wiedemann-Franz relationship, the resistivity and thermal conductance cannot be optimized independently. The ZT value of most metals is too low to be practical. In semiconductors, doping affects the Seebeck coefficient, electrical conductivity, and thermal conductivity. Therefore, doping has been used to optimize the ZT value, and ZT of about 1 has been routinely obtained in bulk $Bi_2Te_3$ crystals doped to $10^{19}/cm^3$. The material researchers can further improve semiconductor conductivity by using multilayer quantum well (QW) confinements to reduce electron scattering while preserving its Seebeck coefficient and thermal conductivity properties. Theoretical predictions of ZT greater than 3 have been made, and experimental values of ZT =1.5 in QW materials have been reported. The improvement in ZT means we can go to larger $T_h$-$T_c$ with the same efficiency, or higher efficiency with the same $T_{h-Tc}$.

Device researchers are beginning to attempt to exploit the high ZT value from multilayer films with QW confinements. FIG. 10 is a summary of QW materials. Lawrence Livermore National Laboratories attempted to build overlap type junctions out of single layers of P-type and N-type thin film semiconductor material on 10 micron thick mica. ZT values of the thin film material is reasonable (between 0.16 to 0.5), the specific ZT value was only about 0.05, because of the high resistance of 0.8 ohm and high thermal conductance in the device. Thin film QW materials with better electrical conductivity and high ZT values could significantly improve device ZT, and thereby improve the COP of thermoelectric power generators or coolers.

IN SUMMARY

1. We use a unique microchip fabrication method which allows us to make a precise periodic assembly of semiconductor materials including advanced thin films.

2. We use vapor deposition and photolithography to deposit junction connectors onto thermopile slices.

3. We use photolithography masks and wet and dry etching, vias, stencils and metallization screening to form the face sheets with power distribution and connections.

4. We use chip, pick and place technology to pack microthermoelectric devices into larger panels to improve yield while enabling variation in overall dimensions.

5. We use advanced thermoelectric materials to improve overall thermopile efficiency and increase the range of useful applications.

6. Our improved device spatial dimensional range extends the usefulness of the thermopile devices to larger areas or micro-scale cooling sources.

7. The high aspect ratio and high density packing of thermoelectric elements results in low profiles, which facilitates multi-stage designs.

8. Using bulk or thin material sheets and bulk Integrated Circuit and Printed Circuit Board technologies provides inexpensive, precise and repeatable fabrication.

While we have described and illustrated preferred embodiments of the present invention, those skilled in the art will recognize alternatives, alterations, variations, or modifications that might be made to the embodiments without departing from the inventive concept. The description, drawings, and examples are presented not as a way to limit the invention but as a way to identify it. Therefore, interpret the claims liberally in view of this description and limit the claims only as necessary in view of the pertinent prior art.

We claim:

1. A method for fabricating a thermopile slice, comprising the steps of:

(a) bonding a thin film semiconductor sheet having either an n-type or a p-type semiconductor to a substrate containing power distribution circuitry;

(b) stacking and bonding semiconductor sheet-substrate pairs to form a stack having alternating sheets of an n-type and then a p-type semiconductor;

(c) slicing the stack to form a film having alternating strips of an n-type semiconductor and a p-type semiconductor, the strips being separated by the substrate;

(d) bonding the slices from step (c) to a thermally insulative spacer material;

(e) stacking and bonding the slice-spacer pairs from step (c) to form a block; and (f) slicing the block of slice-spacer pairs to form a thermopile slice having an array of thin film semiconductor material separated by spacer materials in a generally checker board arrangement of n-type or p-type islands generally as shown in FIG. 1.

2. The method of claim 1 further comprising the step of removing the spacer materials after step (f) to isolate the islands.

3. A method for generating electrical power in space, comprising the steps of:

(a) fabricating a thermopile slice in accordance with claim 1;

(b) exposing the slice to a temperature gradient by orienting one surface to deep space while reflecting the sun to the other surface; and (c) storing electrical power generated by the temperature gradient across the thermopile slice.

4. A thermopile array that is the product of the process of claim 1.

5. A thermopile array that is the product of the process of claim 2.

* * * * *